United States Patent [19]

Putz

[11] 3,755,754

[45] Aug. 28, 1973

[54] PREDISTORTION COMPENSATION FOR A MICROWAVE AMPLIFIER

[75] Inventor: John L. Putz, Los Altos, Calif.

[73] Assignee: Varian Associates, Palo Alto, Calif.

[22] Filed: Feb. 4, 1972

[21] Appl. No.: 223,598

[52] U.S. Cl. ................ 330/149, 330/151, 332/37 R
[51] Int. Cl. ................ H03f 1/32
[58] Field of Search ................ 330/124, 149, 151; 332/18, 37 R; 328/163; 325/46

[56] References Cited

UNITED STATES PATENTS

| | | | |
|---|---|---|---|
| 3,675,138 | 7/1972 | Standing | 328/163 |
| 3,641,468 | 2/1972 | Hooder | 332/18 X |

*Primary Examiner*—Roy Lake
*Assistant Examiner*—James B. Mullins
*Attorney*—Harry E. Aine et al.

[57] ABSTRACT

A predistortion circuit for compensating distortion in a final amplifier includes a first directional coupler for separating a portion of the input modulated microwave signal into first and second channels having first and second signal components therein, respectively. The second signal component is fed to a distortion amplifier having a distortion transfer characteristic substantially similar to that of the final amplifier to be corrected. The distorted output of the distortion amplifier is proportioned in amplitude by a variable attenuator and combined in phase opposition with the larger undistorted first microwave signal in a second directional coupler to form a composite predistortion microwave signal having distortion components inverted in phase relative to thephase of the undistorted components. The distortion components in the composite predistorted input signal to the amplifier cancel the distortion components introduced by the final amplifier to produce an output signal in the final amplifier having substantially reduced distortion components.

10 Claims, 9 Drawing Figures

WITHOUT PREDISTORTION CORRECTION

WITH PREDISTORTION CORRECTION

PREDISTORTION COMPENSATION FOR A MICROWAVE AMPLIFIER

DESCRIPTION OF THE PRIOR ART

Heretofore, various schemes have been proposed for reducing distortion in a final amplifier. One of these prior schemes was to predistort the input signal to the final amplifier in such a manner as to compensate for non-linearities and other distortions which were introduced by the final amplifier. In its simplest form the predistortion circuit had gain and phase transfer characteristics that were opposite to those of the final amplifier such that the composite gain and phase transfer characteristic for both the predistortion circuit and the final amplifier were flat or linear. This scheme served to reduce intermodulation components if the response bandwidth of the predistortion circuit was at least as great as the maximum carrier frequency separation of the input signal. Such prior predistortion circuits were active or passive.

One of the problems with such a predistortion system is that the predistortion circuit should have a bandwidth similar to the bandwidth of the final amplifier. Since solid state devices in the microwave range of 4GHz have been limited to operable bandwidths less than 100MHz, this type of predistortion amplifier is generally inadequate for compensating satellite communication amplifiers having a bandwidth of approximately 500MHz.

In another example of a prior art predistortion circuit, the input signal to a final traveling wave tube amplifier is modified in a predistortion circuit to compensate for distortion, at least in part, by adding to the input microwave signal a corrective signal derived from the input signal. The corrective signal is arranged to have a phase and/or amplitude which is made dependent on the modulation component of the input microwave signal. Such a scheme is disclosed in British Pat. No. 1,218,947 published, Jan. 31, 1971.

The problem with this latter scheme is that the predistortion circuit responds only to the lower frequency modulation of the input microwave signal and is basically concerned with correcting the amplitude and phase distortion encountered with a single modulated signal. Improvement in multi-signal cross modulation is taken for granted and is shown to occur experimentally. However, the conditions for best cross-modulation improvement need not be the same as those for best linearity. Moreover, this scheme is limited in operable bandwidth due to limited bandwidth of the components employed.

In other prior art, intermodulation, i.e., the generation of spurious frequencies when amplifying multiple signals at different frequencies, has been improved by employing a predistortion circuit which separates the microwave input signal into two components and passes one of the components through a non-linear device which will generate intermodulation components similar to those produced by the final amplifier. A balanced modulator at microwave frequencies was then utilized in the second channel for operating on the signal containing the intermodulation components for removing the carrier content therefrom. The output of the balanced modulator was then combined with the first part of the input signal in such a way i.e., with amplitude and phase, such that the composite combined signal contained intermodulation components which when amplified by the final amplifier would essentially cancel the intermodulation components introduced in the final amplifier.

The problem with this predistortion circuit was that the balanced modulator, utilized for cancelling the carrier in the distorted second signal, was complicated and difficult to adjust and operated only over a very narrow range of frequencies and drive levels. As a consequence, this system was impractical for multi-channel microwave communication links.

SUMMARY OF THE PRESENT INVENTION

The principal object of the present invention is the provision of improved predistortion compensation for a microwave amplifier.

In one feature of the present invention, a predistortion circuit for compensating the final amplifier is provided which separates the input signal into first and second components in first and second channels. The second component is amplified by a distortion amplifier having similar non-linear transfer characteristics to those of the final amplifier to introduce distortion components into the second signal. The distorted second signal is then recombined with the first signal in phase opposition thereto such that the undistorted signal components are inverted in phase relative to the distortion signal components in the predistorted input signal to the final amplifier such that the distortion components will cancel in the final amplifier, thereby compensating for the distortion in the final amplifier.

In another feature of the present invention, the predistortion circuit includes a phase shifter for shifting the phase of the distortion signal components relative to the undistorted signal components, such that when the distorted signal components are combined with the undistorted signal components, the desired composite predistortion signal is obtained.

In another feature of the present invention, the undistorted and distorted signal components are combined in substantial phase opposition in a directional coupler and thence fed to the input of the final amplifier.

In another feature of the present invention, the predistortion circuit includes means for combining the undistorted and the distorted microwave signal components, in substantial phase opposition, with the amplitude of the undistorted signal components having a voltage substantially twice the amplitude of the voltage of the distorted microwave signal components, such that in the composite recombined predistorted signal the distortion components are inverted in phase relative to the derived undistorted signal components.

Other features and advantages of the present invention will become apparent upon perusal of the following specification taken in connection with the accompanying drawings wherein;

DESCRIPTION OF PREFERRED EMBODIMENTS

Figure 1:
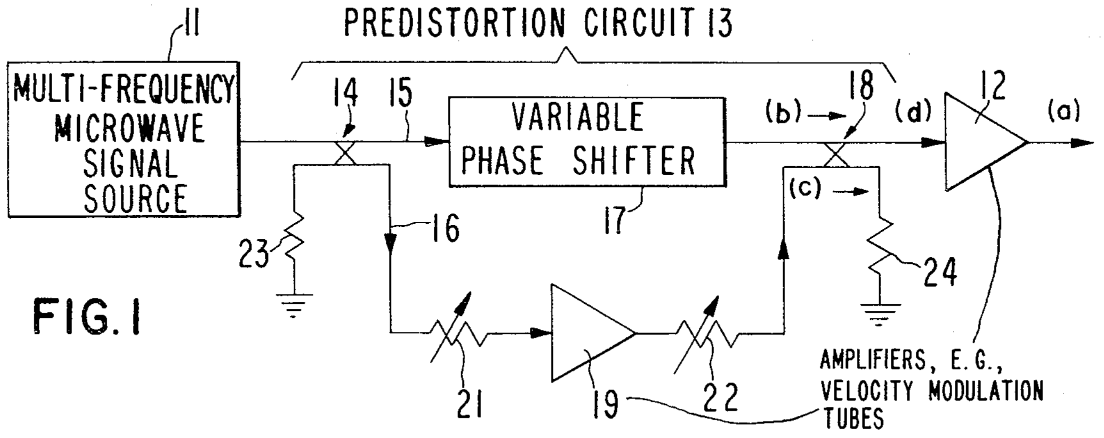
FIG. 1 is a schematic circuit diagram, partly in block diagram form, depicting a microwave circuit in corporating features of the present invention.

Referring now to FIG. 1, there is shown a microwave amplifier system incorporating features of the present invention. The microwave amplifier system of FIG. 1 includes a multi-frequency source of microwave signals 11, each of the microwave signals including a carrier with its sideband modulation components. In some systems the carrier may be suppressed. In a typical example, the multi-frequency microwave source 11 may comprise an antenna for receiving microwave signals over a satellite microwave communication link. The communication link may have a bandwidth of approximately 500MHz in the 4GHz frequency range. The microwave signals to be amplified are fed to a final microwave amplifier 12 via a predistortion circuit 13. The final amplifier may comprise for example a traveling wave tube, klystron, cross-field amplifier, or the like. The output of the amplifier 12 is fed to a suitable utilization device such as a transmitting antenna.

The predistortion circuit 13 serves to distort the input signals to be amplified by amplifier 12 in such a manner as to introduce distortion components which will cancel distortion components to be introduced by the final amplifier 12. In this manner, the total effective distortion of the amplifier system is substantially reduced. As used herein microwave is defined to mean electromagnetic wave energy of a frequency in excess of 200MHz.

The distortion circuit 13 includes a first directional coupler 14 connected to receive the output of the multifrequency source 11 for separating the input microwave signal into first and second microwave channels 15 and 16, respectively. In a typical example, the directional coupler 14 comprises a coaxial directional coupler which reduces the power of the second signal coupled into the second channel 16 by approximately 10db relative to the microwave signal retained in the first channel 15. The microwave signal in the first channel is fed through a variable phase shifter 17 to the input of a second 10db directional coupler 18 where it is recombined with the distorted second microwave signal derived from the second channel 16 to form the composite predistortion signal fed to the input of the final microwave amplifier 12.

In the second channel, the microwave signal is fed to a distortion amplifier 19 via a variable attenuator 21. The variable attentuator 21 controls the drive level to the distortion amplifier 19. The distortion amplifier 19 preferably has a transfer charcteristic identical to or quite similar to the transfer characteristic of the final amplifier 12 such that the distortion amplifier 19 will introduce into the second microwave signal distortion components of a character substantially identical to the distortion components to be introduced by the final amplifier 12. The distortion amplifier 19 may comprise an amplifier of the same type as the final amplifier or it may, for conservation of power, comprise a solid state amplifier.

The distorted output of distortion amplifier 19 is fed via a variable attenuator 22 to the other input of the second directional coupler 18 for combining the distorted second signal with the undistorted first signal in phase opposition to form a composite predistortion signal fed to the input of the final amplifier 12. The directional couplers 14 and 18 are terminated with resistive loads 23 and 24 to avoid undesired reflections therefrom.

Figure 2:
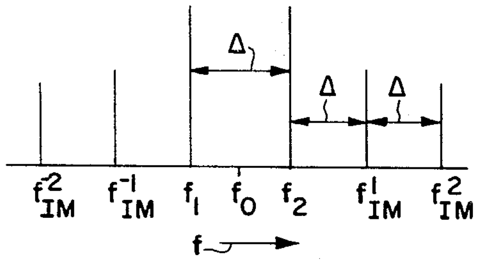
FIG. 2 is a spectrum of the output microwave signal taken from point (a) in FIG. 1 and showing two carrier signals with their intermodulation components without predistortion correction.
Figure 4:
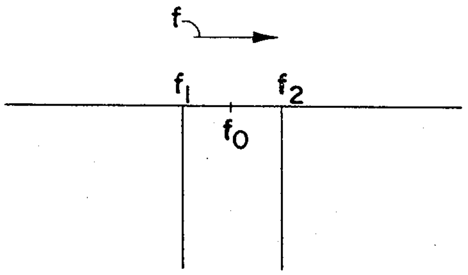
FIG. 4 is a spectrum of th signal at point (b) in the circuit of FIG. 1 and depicting the undistorted phase inverted input signal component with two carrier frequencies present.

Referring now to FIG. 2, there is shown a spectrum of the output microwave signal as found in the output of the final microwave amplifier 12, and depicting an intermodulation type distortion obtained without the advantage of a predistortion circuit when amplifying two microwave carrier signals $f_1$ and $f_2$ separated by a frequency $\Delta$. More particularly, in such a case, the intermodulation distortion causes microwave intermodulation distortion components to be produced at frequencies separated from each other and from the carriers $f_1$ and $f_2$ by integer multiples of the separation frequency $\Delta$.

Although only four such separate intermodulation distortion components are depicted in FIG. 2, a great number of such components may be produced such as ten or more. These intermodulation components are particularly troublesome as they have amplitudes reduced by only approximately 10db from the amplitude of the desired carrier signals and may fall within the frequency range of another channel being amplified by the amplifier 12.

Figure 9:
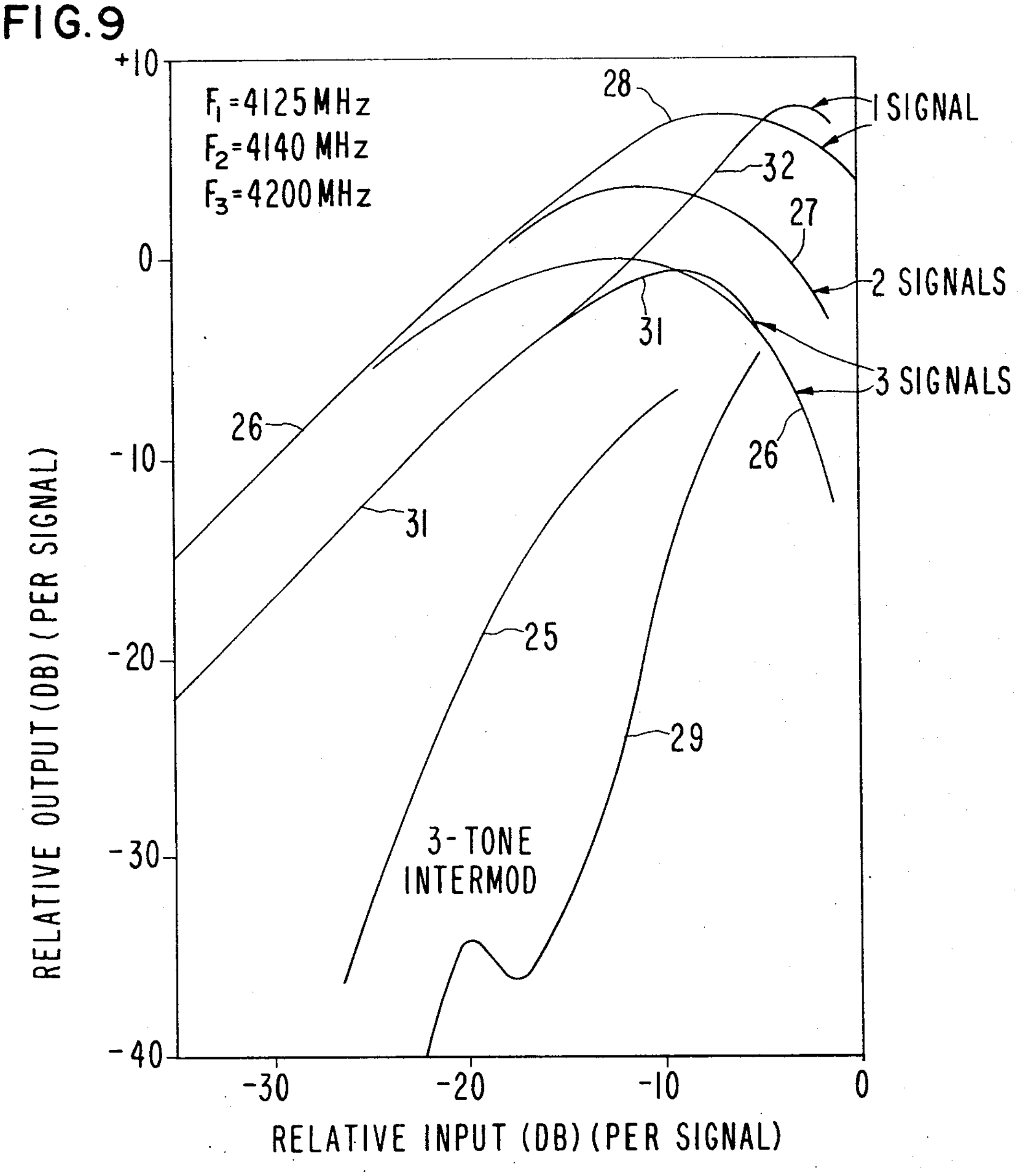
FIG. 9 is a plot of normalized output microwave signal amplitude in db vs. normalized input microwave signal amplitude in db per signal and showing the relative amplitudes of the carrier signals and intermodulation distortion components in the output of the final amplifier with and without predistortion correction.

The amplitude of the intermodulation components relative to the carrier amplitude is a function of the input drive level to the amplifier 12 as shown in FIG. 9 as curve 25 for a three carrier frequency (tone) input signal without predistortion correction. The amplitude of the intermodulation three-tone signal 25 can be compared with the amplitude of the output carrier signals as shown by curves 26, 27 and 28 for a three-tone input, a two-tone input, and a one-tone input, respectively. From curves 25 and 26 it is seen that, when the output amplifier is operated near saturation, the three-tone intermodulation components are of an amplitude reduced by only approximately 10db from the three-tone carrier signal amplitude. At saturation, the three-tone intermodulation components are down by only 7db relative to the three-tone carrier.

By use of the predistortion circuit 13, the amplitude of the intermodulation components can be substantially reduced, when the amplifier is operated near saturation, from −7db without predistortion correction to approximately −16db with predistortion correction. Moreover, when operating the amplifier 12 at a drive level approximately 10db below saturation, the three-tone intermodulation components are reduced by predistortion correction to −32db relative to the three-tone carrier. This is shown by curves 29 and 31 of FIG. 9 where curve 29 shows the three-tone intermodulation component amplitude relative to the three-tone carrier signal amplitude 31.

The one-tone carrier amplitude is shown by curve 32. From the one-tone carrier output curve 32, it is seen that the gain curve is substantially linearized over a wide range of input drive levels, thereby also reducing other types of undesired distortion, such as amplitude modulation-phase modulation conversion.

Figure 3:
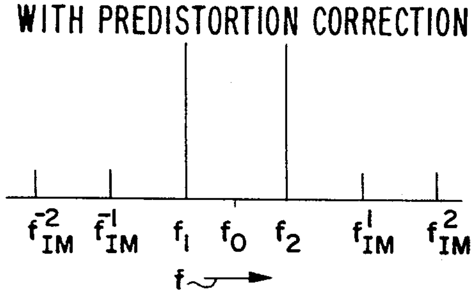
FIG. 3 is a spectrum similar to that of FIG. 2 showing the output with the predistortion circuit in operation to correct signal distortion in the final amplifier.

FIG. 3 shows the spectral output of amplifier 12 with the use of the predistortion corrective circuit 13. Inspection of FIG. 3 shows that the intermodulation components $f_{IM}$, have greatly reduced amplitude compared to the amplitude of the desired carrier at $f_1$ and $f_2$.

Figure 5:
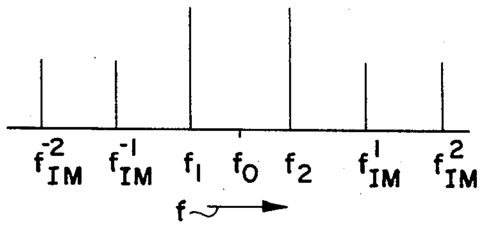
FIG. 5 is a spectrum taken at point (c) in the circuit of FIG. 1 and depicting the predistorted input signal component having two carrier frequencies with intermodulation distortion components.

Referring now to FIGS. 4–7, the operating mechanism of the predistortion corrective circuit 13 will be described in greater detail. The undistorted first microwave signal containing carriers $f_1$ and $f_2$ at point (b), after passage through the variable phase shifter 17, has been inverted in phase relative to the phase of the distorted second microwave signal at point (c) as the signals are combined in the second directional coupler 18 (see FIGS. 4 and 5). The drive level to the distortion amplifier 19 is adjusted via variable attenuator 21 such that the transfer characteristic of the distortion amplifier 19 will be substantially similar to the distortion transfer characteristic to be introduced by the final output amplifier 12. The amplitude of the distortion component as fed to the directional coupler 18 is adjusted via variable attenuator 22 such that the carrier amplitude of the distortion components at $f_1$ and $f_2$ are approximately one half the voltage amplitude of the inverted undistorted carrier components at $f_1$ and $f_2$, as shown in FIG. 5.

Figure 6:
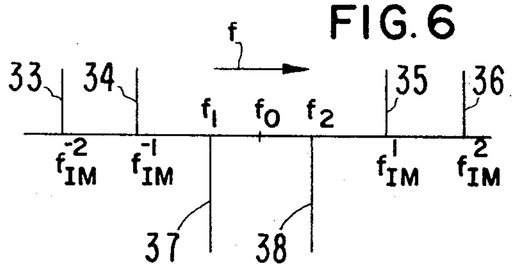
FIG. 6 is a spectrum of the recombined predistortion input signal taken at point (d) in the circuit of FIG. 1 and depicting the phase reversal of the two carrier components relative to the intermodulation distortion components.

When the first and second signals are recombined (added together) in the second directional coupler 18, the resultant phase of the undesired intermodulation components 33 – 36 of FIG. 6 is inverted relative to the phase of the desired carrier components 37 and 38 to be amplified, due to the larger amplitude of the undistorted carrier signals being combined. In addition, the relative amplitudes of the resultant carrier components 37 and 38 are adjusted by adjusting the relative amplitude of the distorted second signal and the undistorted first signal as combined in the directional coupler 18 such that the desired resultant carrier components 37 and 38 have the same amplitude relative to the amplitude of the intermodulation distortion components 33 – 36, aside from the phase reversal, as indicated in FIG. 6.

Figure 7:
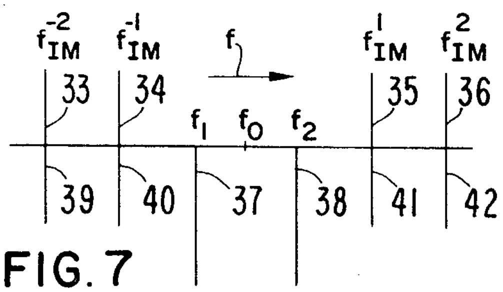
FIG. 7 is an output spectrum taken again at point (a) which is equivalent to the spectrum of FIG. 3 and showing the summation of the distortion components and carrier components as distorted by the final amplifier.

Referring now to FIG. 7, there is shown the combined output microwave spectrum of the final amplifier 12, with the distortion introduced by the final amplifier 12. More particularly, additional intermodulation distortion components, $f_{IM}$, 39 – 42, are introduced in phase opposition and of approximately equal amplitude to the predistortion intermodulation components 33 – 36 such that the pre- and final intermodulation distortion components cancel in the final amplifier 12 to produce the resultant corrected transfer characteristic for the final amplifier, as shown in FIG. 3.

Figure 8:
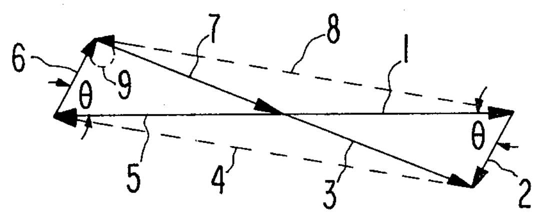
FIG. 8 is a simplified phasor diagram for the circuit of FIG. 1.

Another way to explain the operating mechanism of the predistortion correction circuit 13 is by means of a simplified phasor diagram as shown in FIG. 8. The phasor diagram is normalized to the input RF level and both the amplifier 12 and the distortion amplifier 19 are considered to have unit gain. Phasor 1 represents the input microwave signal voltage to the distortion amplifier 19. Phasor 2 is the microwave distortion component introduced by the distortion amplifier 19 and is proportional to the intermodulation output. Phasor 3 is the carrier phasor at the output of distortion amplifier 19. Phasor 4 is the inverted carrier voltage of the first microwave signal derived from the output of the variable phase shifter 17. Phasor 5 is the resultant predistorted carrier input to the final amplifier 12. Phasor 6 is the microwave distortion component introduced by the final amplifier 12 and is equal and opposite to the distortion component 2 generated by the distortion amplifier 19. Phasor 7 is the resultant output phasor for amplifier 12. Phasor 8 represents the carrier amplitude at the output of the variable phase shifter 17 for a small signal level, that is where the distortion phasor 2 approaches 0 in the limit. Curve 9 is the locus of points for the output of the final amplifier 12. From the locus of points 9 over a wide range of drive levels and distortion levels it is seen that the output of the amplifier is substantially linearized.

The advantage of the predistortion corrective circuit 13 of the present invention is that relatively simple microwave components, such as a variable line stretcher 17 (phase shifter) 17 and directional couplers 14 and 18, may be employed for separating and combining the two signals to obtain the desired composite predistortion signal Cf. the use of a relatively complex and narrow band balanced modulator of the prior art system. Moreover, the distortion corrective circuit 13 of the present invention permits distortion correction over wider bandwidths, as of 10 percent, than had been heretofore obtained.

Although in the predistortion circuit 13 of FIG. 1 a variable phase shifter 17 (delay line) is provided in the first channel 14, this is not a requirement as the necessary relative phase shift may alternatively be achieved by a phase shift in the second channel 16.

The bandwidth of the predistortion circuit 13 depends on the dispersion of the distortion amplifier 19. For a fixed delay (phase shift) difference in the two channels 15 and 16, operation over a bandwidth of 10 percent is obtainable with some loss of performance at the band edges. For wider bands, the two channels 15 and 16 should have the same delay and a fixed phase shifting element is employed in one of the channels 15 or 16.

Also, the distortion means 19 need not provide amplification and as such it may comprise a network of non-linear microwave components such as diodes, varactors, ferrite devices and the like.

What is claimed is:

1. In a distortion corrective input circuit for a microwave amplifier of the type which introduces distortion components of a predetermined character into an input signal supplied thereto, means for separating a modulated microwave signal to be amplified into first and second modulated microwave signal components in first and second microwave channels, respectfully, distortion means for distorting said second microwave signal component in a non-linear manner to produce a distorted second modulated microwave signal component containing both an original signal subcomponent and distortion subcomponents of a character similar to those introduced by said microwave amplifier, and means for combining in substantial phase opposition said first microwave signal component with said distorted second microwave signal component to obtain a predistorted composite modulated input microwave signal to the amplifier, whereby such predistorted composite input signal will compensate the distortion introduced by said microwave amplifier.

2. The apparatus of claim 1 wherein said microwave amplifier is a microwave electron tube.

3. The apparatus of claim 1 wherein said means for combining said modulated first and second microwave signal components in substantial phase opposition includes phase shifter means for shifting the phase of one of said first and second microwave signal components into substantial phase opposition relative to the other.

4. The apparatus of claim 1 wherein said means for combining said first and second microwave signal components in substantial phase opposition includes directional coupler means for adding phase opposed first and second microwave signals to obtain said composite predistorted microwave signal.

5. The apparatus of claim 1 including means for adjusting the relative amplitudes of said first and second microwave signal components such that said first microwave signal component as combined with said distorted second microwave signal component has a substantially higher voltage than that of said distorted second microwave signal component, whereby the undistorted signal components in the combined predistorted composite signal are inverted in phase relative to the distorted signal components of the combined composite signal to be amplified.

6. The apparatus of claim 1 wherein said distortion means and said microwave amplifier to be corrected each include a velocity modulation tube having similar transfer characteristics.

7. The apparatus of claim 3 wherein said phase shifting means is disposed in said first microwave channel.

8. The apparatus of claim 1 wherein said distortion means includes a distortion amplifier having a distortion transfer characteristic similar to that of said microwave amplifier.

9. In a method for predistorting a microwave signal for reducing distortion in an amplified output microwave signal where such distortion is introduced by a microwave amplifier, the steps of:

separating an input modulated microwave signal into first and second modulated microwave signal components in separate microwave channels, distorting said second microwave signal component to produce a distorted second microwave signal component having both original and distortion subcomponents, said distortion subcomponents being similar to those introduced by said microwave amplifier, and combining said first microwave signal component with said distorted second microwave signal component in phase opposition to provide a composite predistorted microwave input signal to he amplifier to be corrected, whereby said composite predistorted microwave input signal will compensate the distortion introduced by said microwave amplifier.

10. The method of claim 9 including the step of proportioning the amplitudes of said combined first and distorted second microwave signals relative to each other such that said first signal as combined with said second signal has a microwave voltage substantially greater than that of said second signal, whereby the phase of the distortion components in said composite predistorted signal will be inverted relative to the phase of the undistorted microwave signal components in said composite predistorted signal.

* * * * *